(12) United States Patent
Kuit et al.

(10) Patent No.: US 8,446,566 B2
(45) Date of Patent: May 21, 2013

(54) METHOD OF LOADING A SUBSTRATE ON A SUBSTRATE TABLE AND LITHOGRAPHIC APPARATUS AND DEVICE MANUFACTURING METHOD

(75) Inventors: Jan-Jaap Kuit, Veldhoven (NL); Niek Snijders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 54 days.

(21) Appl. No.: 11/896,600

(22) Filed: Sep. 4, 2007

(65) Prior Publication Data

US 2009/0059199 A1     Mar. 5, 2009

(51) Int. Cl.
G03B 27/58     (2006.01)
G03B 27/52     (2006.01)

(52) U.S. Cl.
USPC ............................................. 355/72; 355/30

(58) Field of Classification Search ............ 355/30, 355/53, 72–76; 361/234; 378/34, 35
See application file for complete search history.

(56) References Cited

U.S. PATENT DOCUMENTS

| | | | |
|---|---|---|---|
| 4,391,511 A | 7/1983 | Akiyama et al. | |
| 4,561,688 A | 12/1985 | Tsutsui | |
| 4,737,824 A | 4/1988 | Sakai et al. | |
| 5,231,291 A * | 7/1993 | Amemiya et al. | 250/443.1 |
| 5,534,073 A | 7/1996 | Kinoshita et al. | |
| 5,562,396 A | 10/1996 | Yamazaki et al. | |
| 5,564,682 A | 10/1996 | Tsuji | |
| 5,573,877 A | 11/1996 | Inoue et al. | |
| 5,610,683 A * | 3/1997 | Takahashi | 355/53 |
| 5,793,474 A | 8/1998 | Nishi | |
| 5,922,605 A * | 7/1999 | Feurstein et al. | 436/55 |
| 5,923,408 A | 7/1999 | Takabayashi | |
| 6,226,073 B1 * | 5/2001 | Emoto | 355/53 |
| 6,252,758 B1 | 6/2001 | Nagao et al. | |
| 6,257,564 B1 | 7/2001 | Avneri et al. | |
| 6,496,350 B2 * | 12/2002 | Fujiwara | 361/234 |
| 6,628,503 B2 | 9/2003 | Sogard | |
| 6,721,035 B1 * | 4/2004 | Segers et al. | 355/53 |
| 6,762,826 B2 | 7/2004 | Tsukamoto et al. | |
| 7,070,661 B2 * | 7/2006 | Eiriksson et al. | 118/725 |

(Continued)

FOREIGN PATENT DOCUMENTS

| | | |
|---|---|---|
| EP | 1 077 393 A2 | 2/2001 |
| EP | 1 241 706 A2 | 9/2002 |

(Continued)

OTHER PUBLICATIONS

English Abstract for JP6-2288913 A published Dec. 15, 1987, 1 pg.

(Continued)

*Primary Examiner* — Hung Henry Nguyen
(74) *Attorney, Agent, or Firm* — Sterne, Kessler, Goldstein & Fox P.L.L.C.

(57) ABSTRACT

The invention relates to a method of loading a first object on a second object in a lithographic apparatus. The method includes: a) loading the first object on the second object, b) waiting a predetermined time interval and c) performing a relaxation action. The first object may be a substrate and the second object a substrate table. The first object may also be a substrate table and the second object a support structure, supporting the substrate table.

26 Claims, 5 Drawing Sheets

U.S. PATENT DOCUMENTS

| | | | |
|---|---|---|---|
| 7,718,925 B2 | 5/2010 | Goto et al. | |
| 2001/0002871 A1 | 6/2001 | Nagao et al. | |
| 2003/0067734 A1 | 4/2003 | Nakano | |
| 2003/0102682 A1 | 6/2003 | Kurokawa | |
| 2005/0039685 A1 | 2/2005 | Eiriksson et al. | |
| 2005/0181711 A1 | 8/2005 | Starikov et al. | |
| 2005/0252455 A1* | 11/2005 | Moriya et al. | 118/729 |
| 2006/0023394 A1 | 2/2006 | Bain et al. | |
| 2007/0103659 A1* | 5/2007 | Yoshitake et al. | 355/53 |
| 2007/0128889 A1 | 6/2007 | Goto et al. | |
| 2008/0316461 A1 | 12/2008 | Compen | |
| 2009/0086187 A1 | 4/2009 | Compen | |
| 2010/0195080 A1 | 8/2010 | Compen | |

FOREIGN PATENT DOCUMENTS

| | | |
|---|---|---|
| JP | 59-046030 A | 3/1984 |
| JP | 61-094322 A | 5/1986 |
| JP | 6-2288913 A | 12/1987 |
| JP | 2000-021964 A | 1/2000 |
| JP | 2001-127145 A | 5/2001 |
| JP | 2002-305238 A | 10/2002 |
| JP | 2003-115442 A | 4/2003 |
| JP | 2003-321117 A | 11/2003 |
| JP | 2007-158077 A | 6/2007 |
| WO | WO 2006/090730 A1 | 8/2006 |

OTHER PUBLICATIONS

International Search Report for Application No. PCT/NL2008/050412 mailed Aug. 21, 2008, 3 pgs.

International Search Report for Application No. PCT/NL2008/050407 mailed Sep. 25, 2008, 3 pgs.

English translation of Chinese Office Action directed to related Chinese Application No. 200880021138.2, mailed Jul. 18, 2011 from the State Intellectual Property Office of People's Republic of China; 30 pages.

English language translation of Japanese Notice of Reasons for Rejection directed to Japanese Patent Application No. 2010-513139, mailed Dec. 8, 2011, from the Japanese Patent Office; 4 pages.

English-Language Translation of Notice of Reasons for Rejection directed to related Japanese Patent Application No. 2010-513140, mailed Nov. 14, 2011, from the Japanese Patent Office; 4 pages.

International Preliminary Report on Patentability and Written Opinion of the International Searching Authority directed to related International Patent Application No. PCT/NL2008/050412, mailed Dec. 22, 2009, from the International Bureau of WIPO; 7 pages.

International Preliminary Report on Patentability and Written Opinion of the International Searching Authority directed to related International Patent Application No. PCT/NL2008/050407, mailed Dec. 22, 2009, from the International Bureau of WIPO; 8 pages.

Non-Final Rejection mailed Sep. 12, 2012 for U.S. Appl. No. 12/451,749, filed Apr. 16, 2010; 26 pages.

U.S. Appl. No. 13/649,696, Jan-Jaap KUIT, "Method of Loading a Substrate on a Substrate Table and Lithographic Apparatus and Device Manufacturing Method," filed Oct. 11, 2012.

Final Rejection mailed Jan. 16, 2013 for U.S. Appl. No. 12/451,749, filed Apr. 16, 2010; 27 pages.

* cited by examiner

METHOD OF LOADING A SUBSTRATE ON A SUBSTRATE TABLE AND LITHOGRAPHIC APPARATUS AND DEVICE MANUFACTURING METHOD

FIELD

The present invention relates to a method of loading a first object on a second object in a lithographic apparatus, and a lithographic apparatus constructed to hold a first object on a second object. The invention further relates to a device manufacturing method, a computer program, and a data carrier, comprising such a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When a substrate is positioned on a substrate table, thermal and mechanical stresses may be induced in the substrate, which may negatively influence the quality pattern transfer. Therefore it is an object to reduce the stress.

SUMMARY

According to an aspect there is provided a method of loading a first object on a second object in a lithographic apparatus, wherein the method includes: loading the first object on the second object, waiting a predetermined time interval, and performing a relaxation action.

According to an aspect there is provided a lithographic apparatus constructed to hold a first object on a second object, wherein the lithographic apparatus is arranged to load the first object on the second object, wait a predetermined time interval, and perform a relaxation action.

According to an aspect there is provided a device manufacturing method comprising transferring a pattern from a patterning device onto a substrate, wherein the device manufacturing method comprises performing the method according to the above.

According to an aspect there is provided a computer program, when loaded on a computer arrangement, is arranged to perform any one of the methods according to the above.

According to an aspect there is provided a data carrier comprising a computer program according to the above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
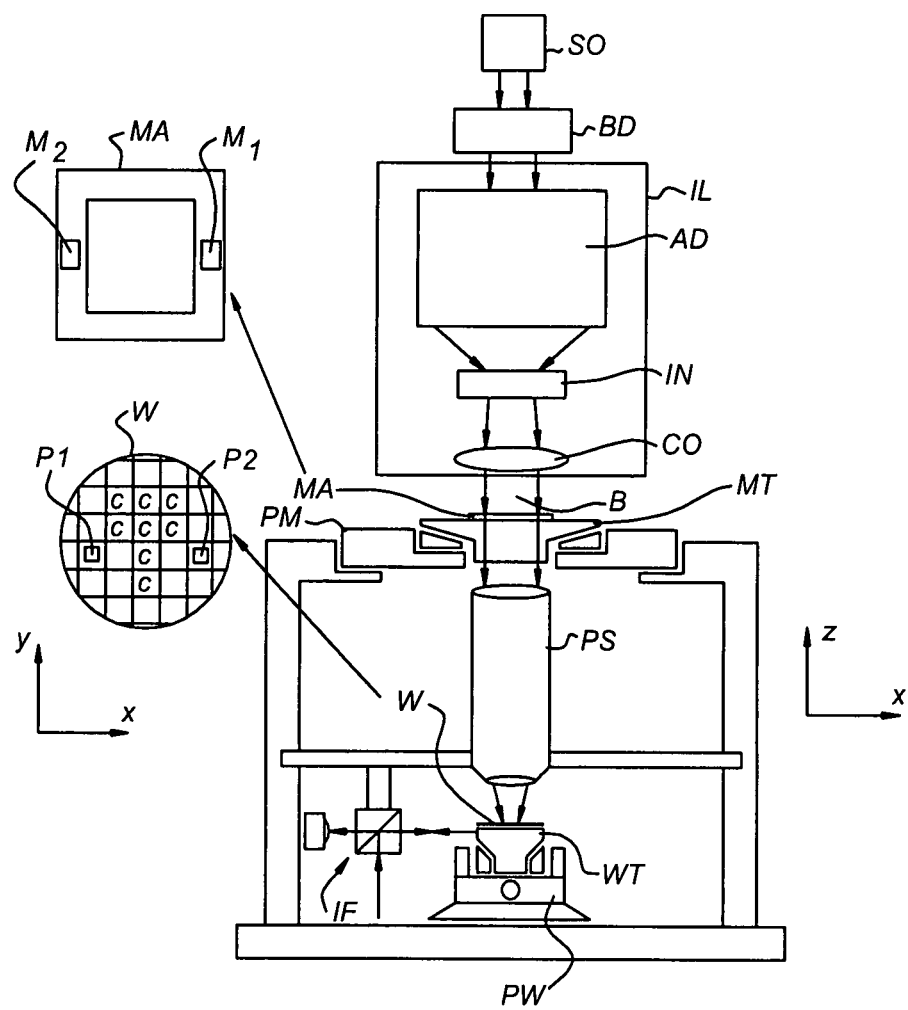
FIG. 1 schematically depicts a lithographic apparatus according to an embodiment of the invention.

FIG. 1 schematically depicts a lithographic apparatus according to one embodiment of the invention. The apparatus includes:

- an illumination system (illuminator) IL configured to condition a radiation beam B (e.g., UV radiation or EUV radiation);
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WT constructed to hold a substrate (e.g. a resist-coated wafer) W and connected to a second positioner PW configured to accurately position the substrate in accordance with certain parameters; and
- a projection system (e.g., a refractive projection lens system) PS configured to project a pattern imparted to the radiation beam B by patterning device MA onto a target portion C (e.g., comprising one or more dies) of the substrate W.

It will be understood that other lithographic apparatus exist or may be conceived that may comprise other elements. For instance, a stepper or a maskless exposure tool may not have a first positioner PM.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
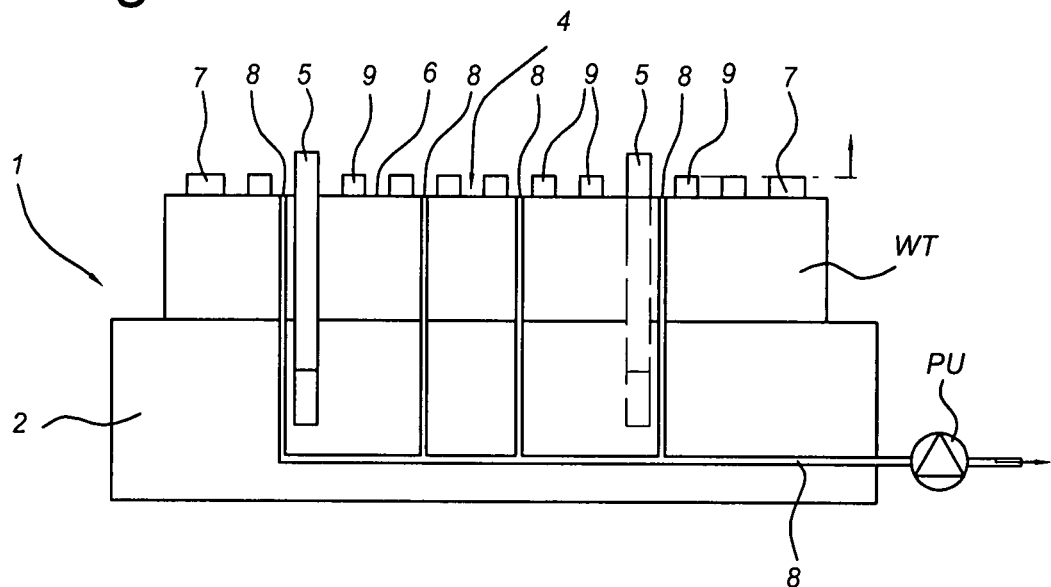
FIG. 2 schematically depicts a cross sectional view of a substrate support according to an embodiment, FIG. 3 schematically depicts a top view of a substrate support according to an embodiment, FIGS. 4a and 4b schematically show a cross sectional view of a substrate table according to an embodiment, FIG. 5 schematically depicts a cross sectional view of a substrate support according to an embodiment, FIG. 6 schematically depicts a top view of a substrate support according to an embodiment, FIG. 7 schematically depicts a substrate support according to an embodiment, FIG. 8 schematically depicts a computer according to an embodiment.
Figure 3:
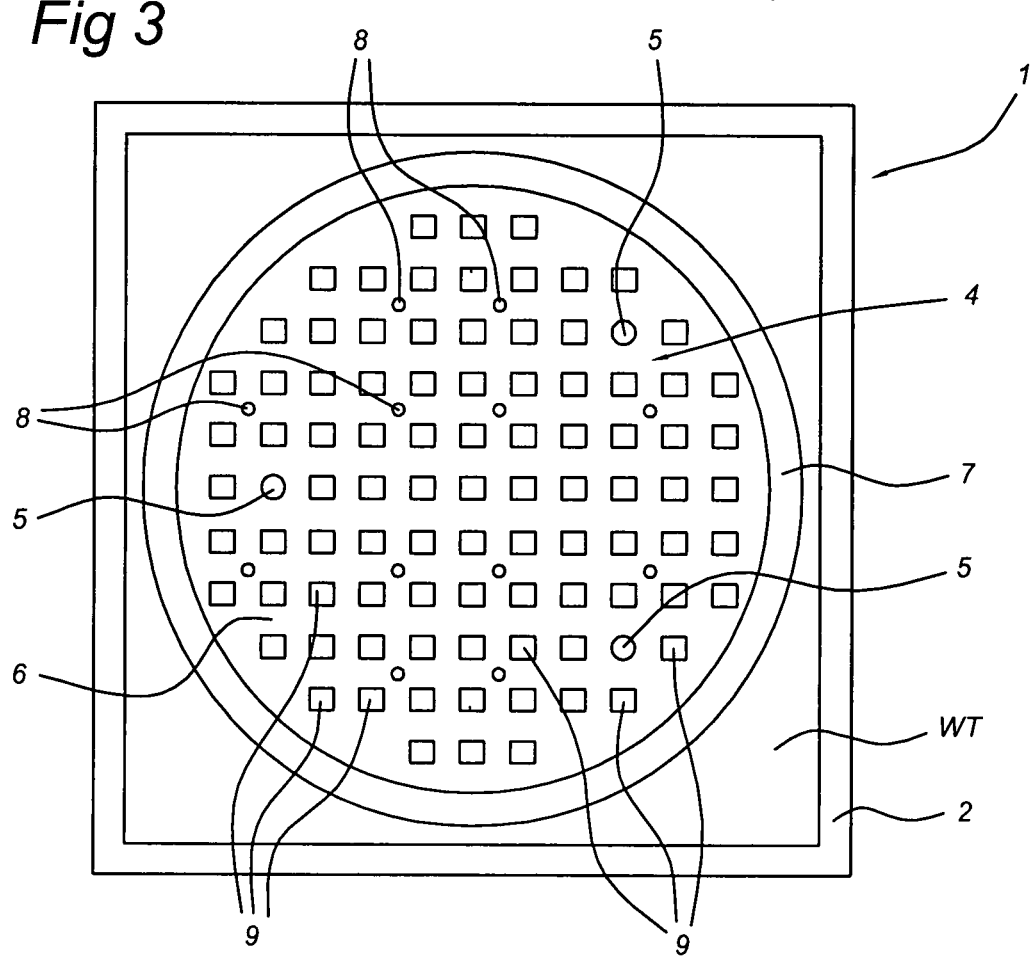

FIGS. 2 and 3 show a side view and top view of a substrate support according to an embodiment, respectively. The substrate support is generally indicated with the reference numeral 1. The substrate support 1 comprises a support structure 2 (for example a mirror block, also called chuck) on which a substrate table WT is placed (and possibly clamped).

The top side of the substrate support 1 comprises a vacuum clamp 4 to clamp a substrate W on the substrate support 1. The substrate support 1 comprises further three retractable pins 5, often referred to as e-pins, which are movable with respect to the substrate support 1 between an extended position in which the pins 5 extend from the substrate support 1 and a retracted position in which the pins 5 are retracted in the substrate support 1.

It will be understood that FIG. 2 shows a possible embodiment. According to another embodiment, the e-pins 5 may not be part of the substrate support 1, but may be part of the support structure and/or a structure supporting the substrate support 1. The e-pins 5 may for instance also be part of the second positioner PW as described with reference to FIG. 1. The retractable pins 5 are movable in a substantially vertical direction, i.e., in a direction substantially perpendicular to a main plane of a substrate W to be supported by the pins 5. The retractable pins 5 may be used for transfer of a substrate W between the substrate support 1 and a robot or any other type of substrate handler. The retractable pins 5 are provided so that a robot may be placed under the substrate W for supporting it. When the robot is configured to hold the substrate W at the sides or top, the retractable pins 5 may be omitted.

A robot may place a substrate W on the pins 5 in the extended position. Then the pins 5 may be moved to the retracted position so that the substrate W comes to rest on the support surface of the substrate support 1. After a substrate W supported by the substrate support 1 is exposed to a patterned beam of radiation, it may be exchanged for another one. For exchange of the substrate W it is lifted from the substrate table WT by the retractable pins 5 which are moved from the retracted position to the extended position. When the pins 5 are in the extended position, the substrate W may be taken over by the robot or any other type of substrate handler.

The vacuum clamp 4 is formed by a recessed surface 6 which is surrounded by a sealing rim 7. An air suction conduit 8 is provided to create a low pressure in a vacuum space delimited by the recessed surface 6, the sealing rim 7 and a substrate W placed or to be placed on the substrate support 1. The air suction conduit 8 is connected to an air suction pump PU to draw air out of the vacuum space. The lower pressure provides a vacuum force which draws a substrate W above the supporting surface towards the substrate support 1.

In the recessed surface 6 a number of burls (extrusions) 9 are arranged. The top ends of the burls 9 provide support surfaces for a substrate W to be placed on the substrate support 1. The sealing rim 7 and the top ends of the burls 9 may be arranged in substantially the same plane to provide a substantial flat surface for supporting a substrate W with a relatively small contact area. The sealing rim 7 acts as a seal and does not need to have contact with the substrate W. A very small gap may exist between the substrate W and the rim 7 to create a controlled leakage.

In an embodiment of the substrate support 1 two or more vacuum clamps may be provided as clamping devices. In fact, also other types of clamping devices may be provided for providing an attracting force exerted on the substrate W, such as an electrostatic, magnetic, or electromagnetic clamp.

When a substrate W is positioned on a substrate table WT and clamped to the substrate table WT, the temperature of the substrate W and the temperature of the substrate table WT may be different as well as in distribution as in total. Also, temperature differences may be present within the substrate W or within the substrate table WT. After the substrate W is positioned on the substrate table WT, these temperature differences will neutralize and a temperature balance will settle. As a result of these changing temperatures, the substrate W and the substrate table WT may deform and will experience thermal stresses. So, a substrate W may experience thermal stresses when it is clamped onto a substrate table WT and its initial temperature just before loading deviates from the temperature of the substrate table WT. The thermal stresses may cause the substrate W to slip over the substrate table (over burls 9) which leads to positioning errors.

Stress in the substrate W may also be induced by positioning the substrate W on the substrate table WT. For instance, when the substrate W is placed on the retractable pins 5 in the extended position, the substrate W may first touch one pin 5, before touching the other pins 5. This may cause mechanical stress, referred to as load induced stress.

It will be understood that stress may be induced in the substrate W when it is positioned (and possibly clamped) on the substrate table WT. Substrate load induced stresses and thermal stresses are a large overlay contributor.

Since the substrate W may be clamped in another form than desired, the overlay performance of the projections of the lithographic apparatus may decrease which may have a negative influence on product quality.

A possible way to reduce thermal stress is to accurately control the temperature of the substrate W and match it to the temperature of the substrate table WT before loading the substrate W to the substrate table WT. However, this is a time-consuming method which requires devices to measure and control the temperature of the substrate W (and possibly the substrate table WT). Accurately controlling the substrate temperature may be relatively complex and expensive and may result in a throughput penalty.

Embodiments are provided that may at least partially reduce thermal stress and load induced stress that may occur as described above. According to the embodiments provided here, a first object is first loaded on a second object in a lithographic apparatus and after a predetermined time interval, in which temperature differences may be balanced, a relaxation action is performed in which the first object and/or the second object is/are allowed to relax or unstress. As described above, the first object may not be able to relax when loaded on and clamped to the second object due to friction between the first and second object. Therefore, the relaxation action comprises reducing the friction between the first and second object. The first object may be a substrate and the second object may be a substrate table WT. According to an alternative, the first object may be a substrate table WT and the second object may be a support structure 2, supporting the substrate table WT. The support structure may also be referred to as a chuck or mirror block.

Reducing the friction can be done by reducing the normal force exerted by the second object supporting the first object. Several embodiments for doing this will be described below.

There is provided a method of loading a first object on a second object in a lithographic apparatus, wherein the method includes: loading the first object on the second object, waiting a predetermined time interval, and performing a relaxation action.

Furthermore, there is provided a lithographic apparatus constructed to hold a first object on a second object, wherein the lithographic apparatus is arranged to load the first object on the second object, wait a predetermined time interval, and perform a relaxation action.

The first object may be a substrate W and the second object may be a substrate table WT. According to an embodiment, the first object may be a substrate table WT and the second object may be a support structure 2 for supporting the substrate table WT.

Furthermore there is provided a device manufacturing method including transferring a pattern from a patterning device onto a substrate W, wherein the device manufacturing method comprises performing one of the methods described in the embodiments.

Examples of such a relaxation action are provided in the embodiments below.

It will be understood that the predetermined time interval for waiting between loading the first object on the second object and performing the relaxation action is chosen such to achieve a temperature balance between the first and second object. For instance, in case an initial temperature difference of a few Kelvins between a substrate W and a substrate table WT needs to settle to a difference on the order of 100-150 mK, a time interval of approximately 3 seconds may be appropriate to allow the temperature difference to balance. Of course, this time interval depend on the initial temperature difference and the thermal properties of the materials.

The relaxation action is performed to reduce stress in the first object and the second object, including thermal stresses and load induced stresses.

It will be understood that the relaxation action, i.e., waiting a predetermined time interval, does not mean that during this action no further or other actions may be performed. For instance, during waiting the predetermined interval, the substrate table WT on which the substrate W is loaded may be moved from a loading position to a measuring position where measurements may be performed on the substrate W (measuring shape, orientation, position etc.) or to an exposure position.

According to an embodiment, the relaxation action comprises temporarily reducing the clamping force exerted by the clamping device.

As described above, a clamping device may be provided and may be applied when the substrate W is loaded on the substrate table WT. The clamping device clamps the substrate W to the substrate table WT by providing an attracting force exerted on the substrate. The clamping device may comprise at least one of a vacuum clamp, an electrostatic clamp, a magnetic clamp and an electromagnetic clamp.

According to this embodiment, the relaxation action comprises temporarily reducing the clamping force.

There is provided a method as described above, wherein the loading comprises using a clamping device to clamp the substrate to the substrate table by providing an attracting force exerted on the substrate. The clamping device may comprise at least one of a vacuum clamp, an electrostatic clamp, a magnetic clamp and an electromagnetic clamp. The relaxation action of the method may comprise temporarily reducing the clamping force.

Furthermore, there is provided a lithographic apparatus as described above, wherein the lithographic apparatus further comprises a clamping device to clamp the substrate W to the substrate table WT by providing an attracting force exerted on the substrate W and the loading comprises clamping the substrate W to the substrate table WT using the clamping device. The clamping device may comprise at least one of a vacuum clamp, an electrostatic clamp, a magnetic clamp and an electromagnetic clamp. The relaxation action, as may be performed by the lithographic apparatus, may include temporarily reducing the clamping force.

This embodiment is easy to implement as in that it does not require additional hardware features. The embodiment uses hardware that is usually available in a lithographic apparatus and may therefore be easy and cost efficient to implement. In some cases, just unclamping the substrate W may not be sufficient to relax all the stresses in the substrate W. However, the embodiment may provide a very easy way to at least relax some of the stresses present in the substrate W.

According to an embodiment, the relaxation action may include lifting the substrate W from the substrate table WT. This is done after temperature averaging has occurred and is done to give room to relaxation of the stresses. After relaxation has occurred, the substrate W is placed back on the substrate table WT.

Figure 4A:
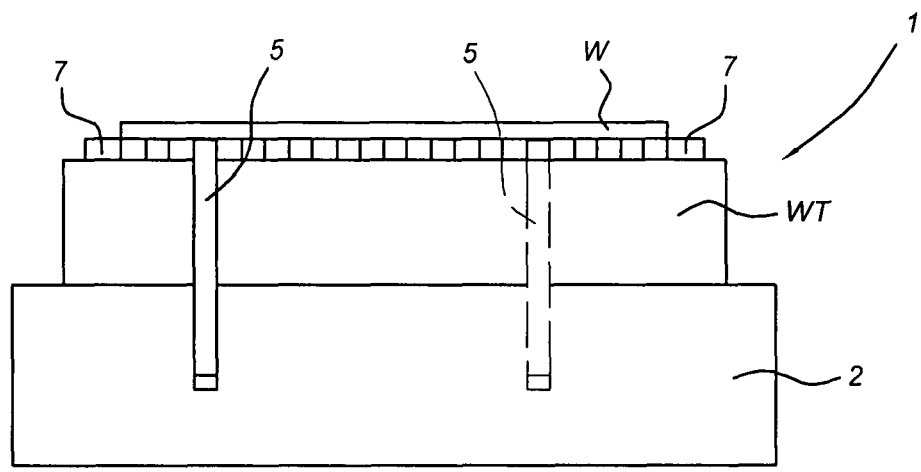
Figure 4B:
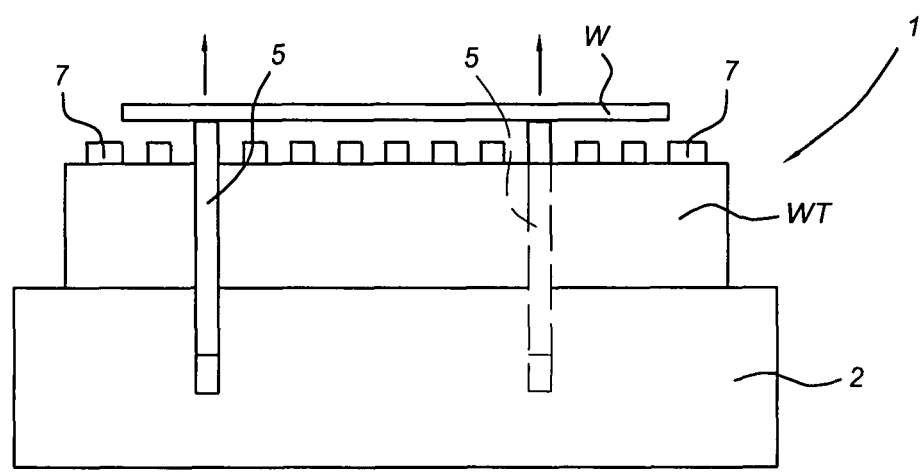

As described above, the substrate table WT may comprises retractable pins 5 which may be used to perform the relaxation action, by lifting the substrate W from the substrate table WT. FIG. 4a depicts a substrate W being loaded on the substrate table WT, the pins being in the retracted position. FIG. 4b shows the substrate W being in a lifted position. After having performed the relaxation action, the substrate W is again placed on the substrate table WT.

There is provided a method as described, wherein the relaxation action may include lifting the substrate W from the substrate table WT. This may be done by moving pins 5, the pins 5 being movable in a direction substantially perpendicular to a main plane of the substrate table, the pins 5 being moved from a retracted position in which the pins are retracted in the substrate support 1 to an extended position in which the pins 5 extend from the substrate support 1 to lift the substrate W from the substrate table WT.

Furthermore, there is provided a lithographic apparatus as described above, wherein the lithographic apparatus includes structure to temporally lift the substrate W from the substrate table and the relaxation action comprises lifting the substrate W from the substrate table WT. The lithographic apparatus may comprise pins 5, the pins being movable in a direction substantially perpendicular to a main plane of the substrate table WT, and the relaxation action comprises moving the pins 5 from a retracted position in which the pins 5 are retracted in the substrate table WT to an extended position in which the pins 5 extend from the substrate table WT to lift the substrate from the substrate table WT. After having lifted the substrate W from the substrate table WT, the substrate W is again positioned on the substrate table WT.

It will be understood that this embodiment may be performed in combination with the previous embodiment, in which the relaxation action comprises reducing the clamping force applied by the clamping device. The clamping force may be reduced before lifting the substrate W from the substrate table WT and may be applied again after having positioned the substrate W on the substrate table after the relaxation action.

This embodiment is easy to implement as in that it does not require additional hardware features. The embodiment uses hardware that is usually available in a lithographic apparatus and may therefore be relatively easy and cost efficient to implement.

According to a further embodiment, the relaxation action is performed by applying a positive pressure on the substrate W and thereby reducing the friction force between the substrate W and the substrate table WT. In case a clamping device is used, the clamping force may be reduced.

The relaxation action may be performed by applying a tightly controlled positive pressure for a predetermined (short) period of time in the compartment between the substrate table WT and the substrate W. By doing this, it is possible to reduce the friction force between the substrate W and the substrate table WT and even to lift the substrate from the substrate table WT and so enable the substrate W to relieve internal stresses. The process can be repeated when a single pulse is insufficient to remove all stresses. By using a number of relatively small pulses instead of one long pulse, floating of the substrate (i.e., movement relative to the table), which may result in potential substrate loss, can be avoided. The air pulses can be generated by pressurizing a small container with air and then releasing the air through holes in the substrate table WT using a simple 2-way valve.

Figure 5:
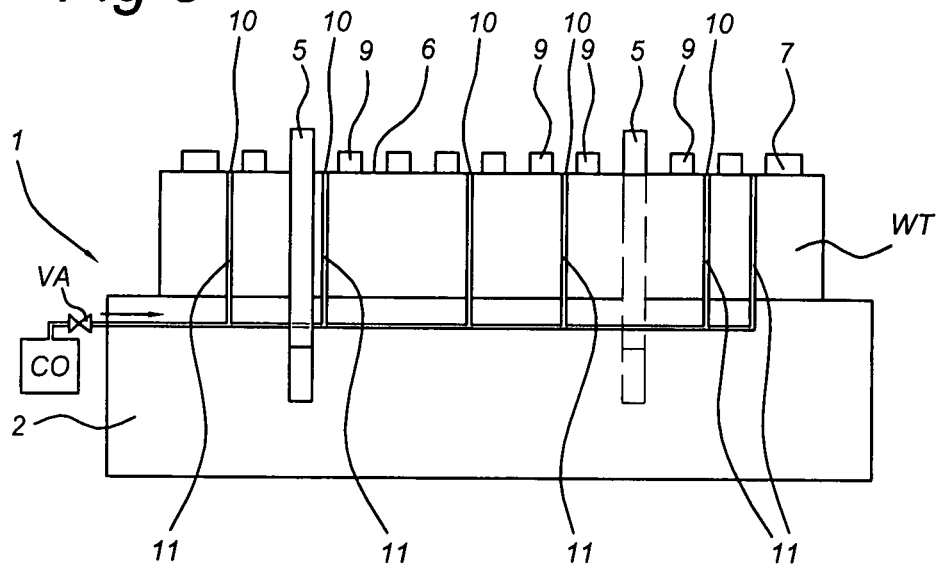
Figure 6:
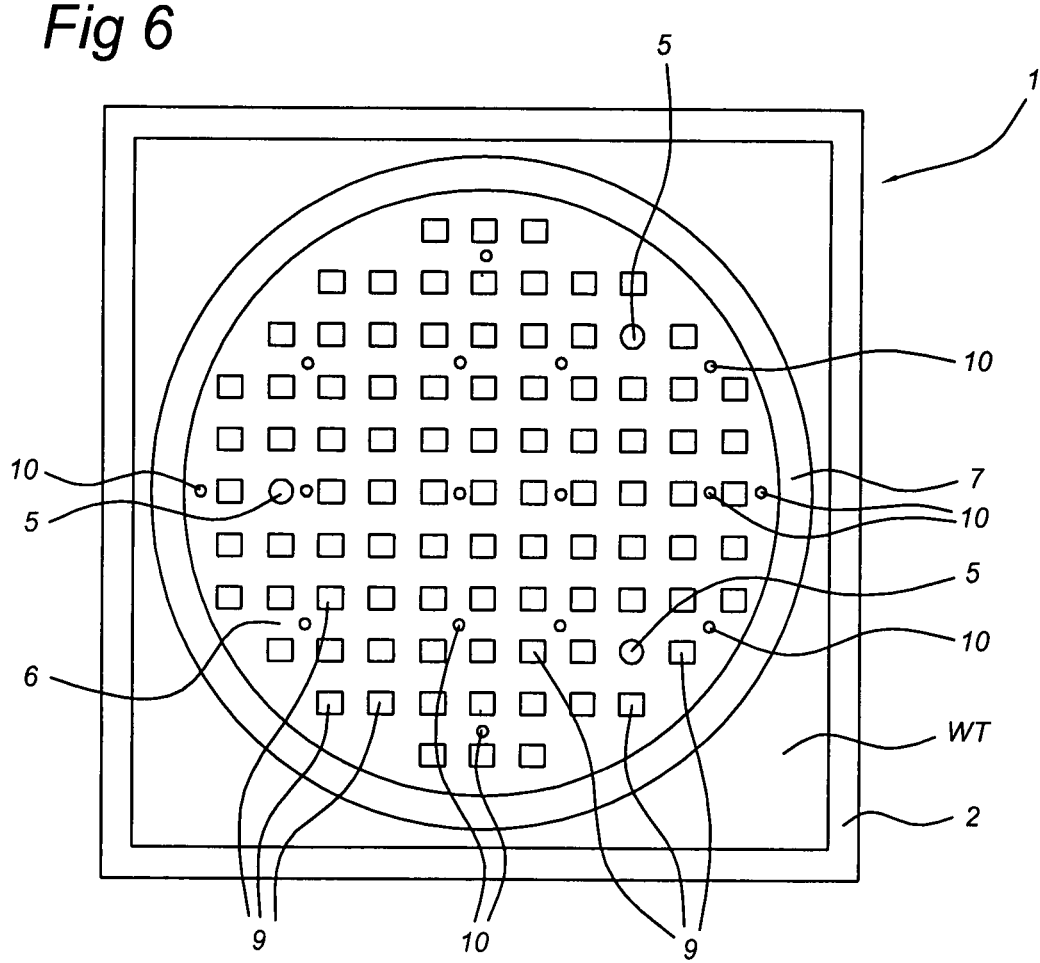

FIGS. 5 and 6 schematically depict a substrate holder 1 according to such an embodiment. As shown in FIG. 5, a number of nozzles 10 are provided. As shown in FIGS. 5 and 6, the nozzles 10 are provided in between the burls 9. However, it will be understood that the nozzles may also be provided in a number of burls 9. In the embodiment shown in FIGS. 5 and 6 the nozzles 10 are evenly distributed over the surface area delimited by the sealing rim 7. The nozzles 10 are connected to a gas supply unit via a gas supply conduit 11 and are configured to provide a jet or gas pulse in a direction substantially perpendicular to the recessed surface, i.e., substantially perpendicular to the main plane of a substrate W to be arranged on the substrate table WT. To actually provide a jet or gas pulse, the gas supply unit may be a pump (not shown), or another source of pressurized gas connected to the supply conduit 11. As shown in FIG. 5, a container CO is provided comprising gas having a pressure that is high with respect to pressure in the vicinity of the substrate table WT. In the supply conduit 11 a valve VA is provided that may be controlled to open and close the supply conduit 11. It is remarked that for the provision of the jets any type of suitable gas may be used, such as air.

There is provided a method as described above, in which the relaxation action comprises supplying a gas in between the substrate W and the substrate table WT. The gas may be supplied by a sequence of at least one gas pulse.

Furthermore there is provided a lithographic apparatus as described above, wherein the substrate table WT comprises at least one nozzle 10 that is connected or connectable to a gas supply unit and is configured to supply gas in between the substrate W and the substrate table WT and the relaxation action may comprise supplying a gas in between the substrate and the substrate table. The lithographic apparatus may be configured to supply the gas in a sequence of at least one gas pulse.

It will be understood that this embodiment may be performed in combination with the previous embodiment, in which the relaxation action includes reducing the clamping force applied by the clamping device. The clamping force may be reduced before supplying the gas may be applied again after the relaxation action.

According to a further embodiment, the relaxation action includes vibrating the substrate table WT. By applying a suitable vibration, the friction force between the substrate W and the substrate table WT is reduced, allowing the substrate to relax. Vibrating may be done at any suitable frequency and with any suitable amplitude, for instance at an amplitude of approximately 1 μm and a frequency of >500 Hz or more.

Figure 7:
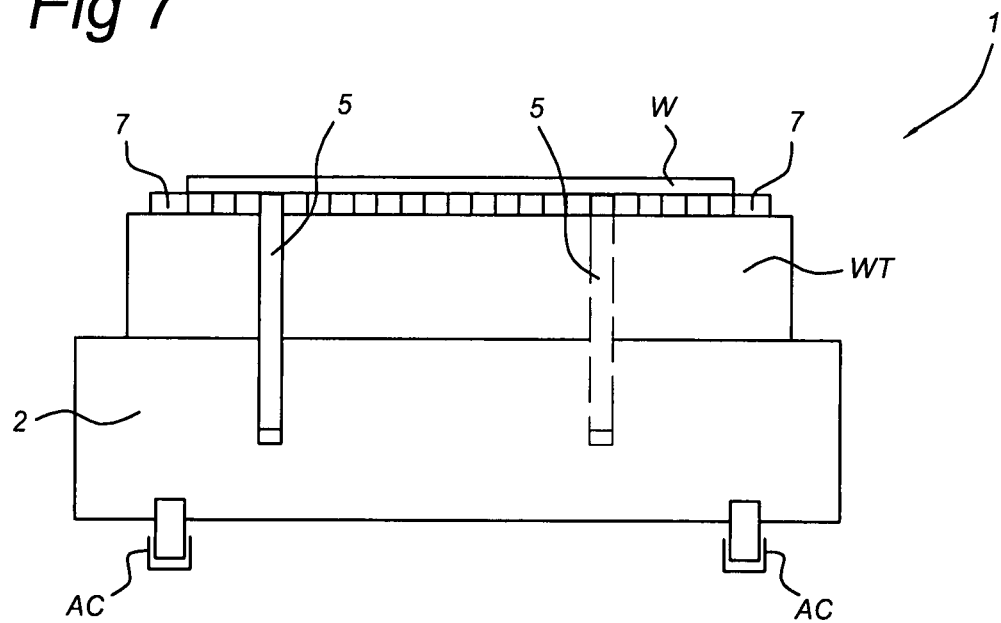

FIG. 7 schematically shows a substrate holder 1, comprising a substrate table WT on which a substrate W is loaded. FIG. 7 further shows a vibration device formed by two actuators AC that may be used to actuate the substrate holder 1 and thus to vibrate the substrate table WT.

The vibration device may be formed by the second positioner PW already described above with reference to FIG. 1. However, also special dedicated actuators may be provided to perform the vibration.

The actuators may specially be provided, but it is also possible to use actuators that are already present, such as short stroke motors driving the support structure. The actuators may be Lorentz type actuators with nm accuracy which have a high bandwidth servo loop. These motors are used to position the support structure and the substrate W during exposure and measurements. By just adding a ditter signal to the normal set point, the support structure can be commanded to move in the target direction and at the same time provide the vibration movements The vibration may be applied a predetermined time interval after the substrate W is loaded on the substrate table WT. A possible applied clamping force may be reduced and the substrate table WT may be vibrated at a high frequency. The vibration may have a small positional amplitude and a large acceleration. This mechanical 'ditter' motion can be used to overcome the friction force between the substrate W and the substrate table WT. The substrate W will then relieve its internal stresses.

The vibration may be applied in a direction substantially perpendicular to the surface of the substrate table WT, i.e., substantially perpendicular to the main plane of a substrate W to be arranged on the substrate table WT. During the downward motion, the normal force exerted by the substrate table WT on the substrate W is temporarily reduced (and thus the friction force) and the substrate W may relax.

According to a variant, the vibration may be applied in a direction substantially parallel to the surface of the substrate table WT, i.e., substantially parallel to the main plane of a substrate W to be arranged on the substrate table WT. As a result of this motion, the substrate W and the substrate table WT may move relatively with respect to each other, thereby reducing the friction force and allowing the substrate W to relax (note that the static friction coefficient is higher than the dynamic friction coefficient).

Of course, the vibration may also be in direction other than the two directions described here, for instance in a diagonal direction, having a component both parallel and perpendicular to the surface of the substrate table WT.

There is provided a method and lithographic apparatus, wherein the substrate table is vibrated at a high frequency and small amplitude. Furthermore, there is provided a lithographic apparatus as described, wherein the substrate table comprises a vibration device, and the relaxation action comprises vibrating the substrate table.

It will be understood that this embodiment may be performed in combination with the previous embodiment, in which the relaxation action includes reducing the clamping force applied by the clamping device. The clamping force may be reduced before supplying the gas may be applied again after the relaxation action.

The embodiments described above describe how to load a substrate W on a substrate table WT. However, the substrate table WT itself may be a separate part that is positioned on the support structure 2. The substrate table WT may be clamped to the support structure 2 using a clamping device which comprises at least one of a vacuum clamp, an electrostatic clamp, a magnetic clamp and an electromagnetic clamp.

The same relaxation procedure as described above can be applied to the substrate table when stresses occur in the substrate table which eventually results in a slip between the substrate table WT and the supporting structure 2.

It will be understood that loading a substrate table WT on a support structure 2 may involve the same problems as loading a substrate W on a substrate table WT, i.e., thermal and mechanical stresses may be induced in the substrate table WT.

Therefore, the above mentioned embodiments may also be used for loading a substrate table WT on a support structure 2.

So there may be provided a method of loading a substrate table on a support structure, wherein the method includes: loading the substrate table on the support structure, waiting a predetermined time interval, and performing a relaxation action.

The loading may include using a clamping device to clamp the substrate table to the support structure by providing an attracting force exerted on the substrate table. The clamping device may comprise at least one of a vacuum clamp, an electrostatic clamp, a magnetic clamp and an electromagnetic clamp.

The relaxation action may include temporarily reducing the clamping force and/or may comprise supplying a gas in between the substrate table and the support structure. The gas may be supplied by a sequence of at least one gas pulse.

The relaxation action may further include vibrating the support structure. The support structure may be vibrated at a high frequency and a small amplitude.

The vibration may be applied a predetermined time interval after the substrate table is loaded on the support structure. A possible applied clamping force may be reduced and the support structure may be vibrated at a high frequency. The vibration may have a small positional amplitude and a large acceleration. This mechanical 'ditter' motion can be used to overcome the friction force between the substrate table WT and the support structure. The substrate table WT will then relieve its internal stresses.

The relaxation action may further include lifting the substrate table WT from the support structure 2, for instance by moving pins, the pins being movable in a direction substantially perpendicular to a main plane of the support structure, the pins being moved from a retracted position in which the pins are retracted in the support structure to an extended position in which the pins extend from the support structure to lift the substrate table from the support structure.

The predetermined time interval may be chosen such to achieve a temperature balance between the substrate table WT and the support structure 2.

The relaxation action may be performed to reduce stress in the substrate table WT.

Furthermore, there may be provided a lithographic apparatus comprising a support structure 2 constructed to hold a substrate table WT, wherein the lithographic apparatus is arranged to load the substrate table WT on the support structure 2, wait a predetermined time interval, and perform a relaxation action.

Figure 8:
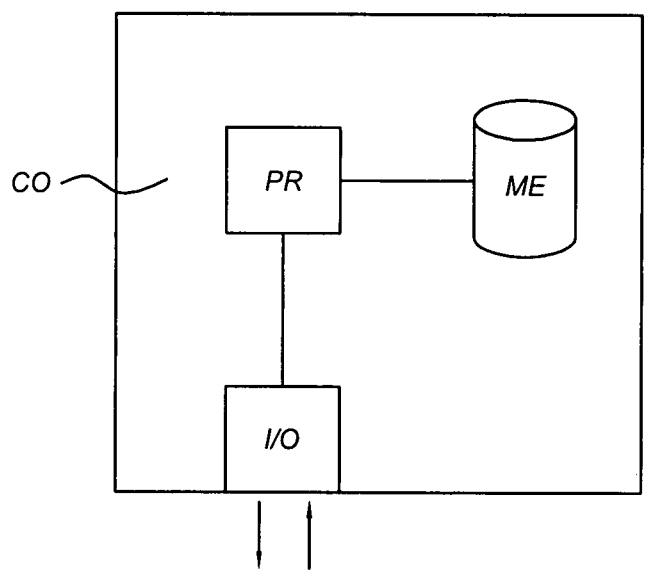

All embodiments described above may be put to practice using a computer CO as for instance shown in FIG. 8. The computer CO may comprise a processor PR, arranged to communicate with an input-output device I/O and a memory ME.

The computer CO may be a personal computer, server, laptop, all these devices are different kind of computers. The memory ME may comprise instructions readable and executable by the processor PR to make the computer CO perform the embodiments described. The computer CO may be arranged to interact with other parts of the lithographic apparatus via input-output device I/O to perform the embodiments described.

FIG. 8 shows a schematic block diagram of an embodiment of a computer CO, comprising a processor PR for performing arithmetical operations. The processor PR is connected to the memory ME that may store instructions and data, such as a tape unit, hard disk, a Read Only Memory (ROM), Electrically Erasable Programmable Read Only Memory (EEPROM) and a Random Access Memory (RAM).

The input output device I/O is arranged to communicate with other computer systems or devices comprised by the lithographic apparatus 1 (not shown) via a communication link.

However, it should be understood that there may be provided more and/or other memories ME and processors PR. Moreover, one or more of them may be physically located at a remote position. The processor PR is shown as one box, however, it may comprise several processors PR functioning in parallel or controlled by one main processor that may be located remote from one another, as is known to persons skilled in the art.

It is observed that, although all connections are shown as physical connections, one or more of these connections can be made wireless. They are only intended to show that "connected" units are arranged to communicate with one another in someway.

There is provided a computer program, when loaded on a computer arrangement, is arranged to perform any one of the methods provided. Also, there is provided a data carrier, comprising such a computer program. The data carrier may be any kind of computer readable medium.

The embodiments described above mention the option to reduce the clamping force. It will be understood that this can be done in combination with all other embodiments. Also, reducing the clamping force may include reducing the clamping force to substantially zero, i.e., not applying a clamping force at all.

The embodiments of providing a gas and applying a vibration can generally be applied with a relatively small throughput loss. Also, there are no restrictions for the substrate table position at which the relaxation action can be executed into existing metrology sequences.

Where lifting the substrate W from the substrate table WT (embodiment 2), this may have a negative impact on pre-alignment accuracy. In addition for machine/substrate safety reasons, lifting the substrate (embodiment 2) can only be done at very specific locations of the substrate table WT which are not throughput optimal.

Based on the above description, it will be understood that the relaxation action is performed to temporarily reduce the friction between the substrate W and the substrate table WT, allowing the substrate W to relax and stress to resolve. Many ways to perform the relaxation action are provided, such as reducing the clamping force, lifting the substrate W, providing gas in between the substrate W and the substrate table WT and vibrating the substrate table WT.

It will be understood that the relaxation action is to be performed in such a way that after the relaxation action, the substrate W is accurately positioned with respect to the substrate table WT in order to enable accurate processing of the substrate W. In fact, the substrate W should be within the capture range of the sensors used to measure the position and orientation of the substrate W, such as an alignment sensor to measure the horizontal orientation of the substrate and a level sensor to measure the surface profile of the substrate. The capture range is in the order of tens of microns.

After the relaxation action, a further measurement action may be performed to measure the position and orientation of the substrate W.

Also, it will be understood that all the embodiments may be used in combination with one or more other embodiments. For instance, vibrating may be done in combination with supply gas and/or reducing the clamping force.

The embodiments may be performed to temporarily overcome the friction force between the first and second object to allow the first object to settle.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. Method of loading a first object on a second object in a lithographic apparatus, the method comprising:
   loading the first object on the second object;
   waiting a predetermined time interval; and
   after waiting the predetermined time interval, wherein the predetermined time interval is chosen such to achieve a temperature balance between the first object and the second object and reducing a friction force between the first object and the second object by performing a relaxation action, wherein the relaxation action comprises vibrating the second object.

2. The method according to claim 1, wherein the first object is a substrate and the second object is a substrate table.

3. The method according to claim 1, wherein the loading the first object comprises a substrate table and the second object comprises a support structure for supporting the substrate table.

4. The method according to claim 1, wherein the loading comprises using a clamping device to clamp the first object to the second object by providing an attracting force exerted on the first object.

5. The method according to claim 4, wherein the clamping device comprises at least one of a vacuum clamp, an electrostatic clamp, a magnetic clamp and an electromagnetic clamp.

6. The method according to claim 4, wherein the relaxation action comprises temporarily reducing the clamping force.

7. The method according to claim 1, wherein the second object is vibrated at a high frequency and a small amplitude.

8. The method according to claim 1, wherein the relaxation action comprises moving pins, the pins being movable in a direction substantially perpendicular to a main plane of the second object, the pins being moved from a retracted position in which the pins are retracted in the second object to an extended position in which the pins extend from the second object to temporarily lift the first object from the second object.

9. The method according to claim 1, wherein the relaxation action is performed to reduce stress in the first object.

10. A system comprising:
    a lithographic apparatus configured to hold a first object on a second object, wherein the lithographic apparatus is arranged to:
    load the first object on the second object;
    wait a predetermined time interval; and
    after waiting the predetermined time interval, wherein the predetermined time interval is chosen such to achieve a temperature balance between the first object and the second object and reduce a friction force between the first object and the second object by performing a relaxation action, wherein the relaxation action comprises vibrating the second object.

11. The system according to claim 10, wherein the first object is a substrate and the second object is a substrate table.

12. The system according to claim 10, wherein the first object is a substrate table and the second object is a support structure configured to supporting the substrate table.

13. The system according to claim 10, wherein the lithographic apparatus further comprises a clamping device configured to clamp the first object to the second object by providing an attracting force exerted on the first object and the loading comprises clamping the first object to the second object using the clamping device.

14. The system according to claim 13, wherein the clamping device comprises at least one of a vacuum clamp, an electrostatic clamp, a magnetic clamp and an electromagnetic clamp.

15. The system according to claim 13, wherein the relaxation action comprises temporarily reducing the clamping force.

16. The system according to claim 10, wherein the lithographic apparatus is further arranged to vibrate at a high frequency and a small amplitude.

17. The system according to claim 10, wherein:
the lithographic apparatus comprises a lifting device configured to temporarily lift the first object from the second object; and
the relaxation action comprises temporarily lifting the first object from the second object.

18. The system according to claim 17, wherein:
the lithographic apparatus comprises pins, the pins configured to be movable in a direction substantially perpendicular to a main plane of the second object, and
the relaxation action comprises moving the pins from a retracted position in which the pins are retracted in the second object to an extended position in which the pins extend from the second object to temporarily lift the first object from the second object.

19. The system according to claim 10, wherein the relaxation action is performed to reduce stress in the first object.

20. The method according to claim 1, wherein reducing the friction force between the first object and the second object comprises adding a ditter signal to an actuator to vibrate the second object.

21. The system of claim 12, further comprising commanding the support structure to move in a target direction and at the same time provide the vibration movements.

22. The method according to claim 1, wherein the relaxation action comprises temporarily lifting the first object from the second object.

23. The method according to claim 1, wherein the relaxation action comprises supplying a gas in between the first object and the second object.

24. The method according to claim 23, wherein the gas is supplied by a sequence of at least one gas pulse.

25. The system according to claim 10, wherein the second object comprises at least one nozzle configured to connect to a gas supply unit and supply a gas in between the first object and the second object and wherein the relaxation action comprises supplying the gas in between the first object and the second object.

26. The system according to claim 25, wherein the system is configured to supply the gas in a sequence of at least one gas pulse.

* * * * *